United States Patent [19]

Richard et al.

[11] Patent Number: 5,550,472
[45] Date of Patent: Aug. 27, 1996

[54] COMBINED RADIO FREQUENCY COIL WITH INTEGRAL MAGNETIC FIELD SHIM SET

[75] Inventors: Mark A. Richard, Cleveland Hts.; Michael A. Morich, Mentor; Labros S. Petropoulos, Solon, all of Ohio

[73] Assignee: Picker International, Inc., Highland Heights, Ohio

[21] Appl. No.: 421,837

[22] Filed: Apr. 13, 1995

[51] Int. Cl.$^6$ .................................................. G01V 3/00
[52] U.S. Cl. ............................................ 324/320; 324/319
[58] Field of Search ..................................... 324/318, 322, 324/319, 320, 300, 307, 309; 128/653.5

[56] References Cited

U.S. PATENT DOCUMENTS

| | | | |
|---|---|---|---|
| 4,587,504 | 5/1986 | Brown et al. | 335/216 |
| 4,698,611 | 10/1987 | Vermilyea | 335/298 |
| 4,733,189 | 3/1988 | Punchard et al. | 324/318 |
| 4,737,716 | 4/1988 | Roemer et al. | 324/319 |
| 4,771,243 | 9/1988 | Vreugdenhil et al. | 324/320 |
| 4,853,663 | 8/1989 | Vermilyea | 335/301 |
| 4,990,877 | 2/1991 | Benesch | 324/318 |
| 5,045,794 | 9/1991 | Dorri et al. | 324/320 |
| 5,179,338 | 1/1993 | Laskaris et al. | 324/318 |
| 5,235,284 | 8/1994 | Tahara et al. | 324/320 |
| 5,349,297 | 9/1994 | DeMeester et al. | 324/318 |
| 5,406,204 | 4/1995 | Morich et al. | 324/318 |

*Primary Examiner*—Louis M. Arana
*Attorney, Agent, or Firm*—Fay, Sharpe, Beall, Fagan, Minnich & McKee

[57] ABSTRACT

A toroidal housing (18), such as a vacuum dewar, contains magnets (10, 12) for generating a temporally constant magnetic field through a central bore (14). Gradient coils (32, 42) are mounted around the bore defining a space therebetween. A radio frequency shield (78) is disposed radially inward from the gradient coils. Inside the radio frequency shield, an inner shimming assembly (60) includes a dielectric cylinder (62) having annular grooves around its periphery. Segmented ferrous material (66) is arranged in annular rings in the grooves. The ferrous material is segmented into small pieces electrically insulated from each other to limit radio frequency and gradient frequency eddy currents. A radio frequency coil (70) is mounted inside of the annular ferrous shims (66). Preferably, additional shim trays (50) which carry shims (54) are mounted in the space between the primary and secondary gradient coils.

16 Claims, 4 Drawing Sheets

COMBINED RADIO FREQUENCY COIL WITH INTEGRAL MAGNETIC FIELD SHIM SET

BACKGROUND OF THE INVENTION

The present invention relates to the magnetic resonance arts. It finds particular application in conjunction with medical diagnostic magnetic resonance imaging and will be described with particular reference thereto. However, it is to be appreciated that the present invention also finds application in magnetic resonance spectroscopy and magnetic resonance imaging for other applications.

Heretofore, magnetic resonance imagers included a series of annular magnets which generated a temporally constant, generally uniform magnetic field through their common bores. In superconducting magnet designs, the magnets were encased in a vacuum dewar. Whether in a vacuum dewar or other housing, a patient receiving bore was defined through the magnets. In general, the longer the bore, the more uniform the magnetic field. Typically, the bore length was on the order of 1.5 to 2.0 meters. The uniformity of the magnetic field is generally characterized in terms of the amplitudes of zonal harmonic field coefficients $Z^0$, $Z^1$, $Z^2$, normalized to a defined diameter spherical volume.

Even such "long bore" magnets had some magnetic field inhomogeneities. Some of the inhomogeneities were attributable to build or manufacturing errors, and some were due to limiting or theoretical characteristics of the magnet design. Such long bore magnets typically had harmonic distortions, due to build errors, on the order of $Z^0$ through $Z^6$. To correct these inhomogeneities, ferrous shims were mounted along the patient receiving bore. These lower order harmonics were cured with a minimal amount of ferrous material. In some imagers, the shims were mounted inside the bore and in others they were mounted outside the bore, e.g., in a superconducting magnetic's cryo-vessel. Typically, shim trays were constructed of a non-ferrous material. The pockets of the non-ferrous trays received ferrous shims, e.g., thin plates of steel coated with a non-conductive polymer or oxide coating. The shims were constrained in the pockets and the trays were mounted inside or outside of the bore.

In magnetic resonance imagers, a magnetic field gradient coil was mounted inside the magnet's bore. Typically, the gradient coil assembly was mounted radially inward from the shims. Imagers with self-shielded gradient coils had a main or primary magnetic field gradient coil and a shield or secondary magnetic field gradient coil which were mounted in a spaced relationship. The shield gradient coil was often placed outside of the bore and, in a superconducting magnet imager, could be placed within the cryo-vessel. With self-shielded gradient coils, the shim trays were often positioned between the primary and shield gradient coils. See, for example, U.S. Pat. No. 5,349,297.

A radio frequency coil was mounted radially inward from the gradient coil(s). A radio frequency shield was mounted between the radio frequency coil and the gradient coils. The radio frequency shield blocked radio frequency signals from reaching the gradient coils, the shims, and other surrounding constructions in which eddy currents could be induced. Radio frequency eddy currents would generate radio frequency signals which would be transmitted into the interior of the radio frequency coil. The eddy radio frequency signals lowered the signal-to-noise ratio during reception of resonance signals and increased the power demands on the radio frequency coil during radio frequency transmission. In addition, the radio frequency shield blocked the transmission of any noise conducted into the bore via the gradient coils.

A cosmetic liner was commonly positioned radially inside the radio frequency coil to prevent the imaged patient from touching the radio frequency and gradient coil constructions and for cosmetic purposes.

One of the difficulties with such magnetic resonance imagers is that the 1.5 to 2.0 meter long bores were claustrophobic to many patients. The long bores also prevented medical personnel from accessing the patient while in the bore. Typically, to perform a medical procedure based on the diagnostic images, the patient needed to be removed from the bore and the diagnostic images reregistered with the patient in the new patient position. If a probe, such as a biopsy needle, was inserted into the patient and the physician wanted to check with the magnetic resonance imager whether it was inserted to the proper location, the patient and probe needed to be reinserted into the bore for another imaging session.

One solution to these problems resides in the use of "short bore" magnets, e.g., 1.25 meters or less. Although short bore magnets render the imager more user friendly and provide improved access to the patient, the temporally constant magnetic field generated by the short bore magnets tends to be less homogeneous. Moreover, such short bore magnets typically have higher than $Z^6$ order harmonic distortions, intrinsic to the magnet design, to be shimmed. Higher order distortions require significantly more ferrous material for shimming than do $Z^6$ and lower order distortions.

The present invention overcomes the above-referenced problems and others.

SUMMARY OF THE INVENTION

In accordance with one aspect of the present invention, a magnetic resonance apparatus is provided. Magnets are disposed in a toroidal housing for defining a temporally constant magnetic field through a central bore of the toroidal housing. A radio frequency coil is disposed in the bore. A radio frequency shield is disposed around the radio frequency coil. Segmented ferrous material is disposed in annular rings around the bore. The segmented ferrous material rings are disposed between the radio frequency coil and the radio frequency shield.

In accordance with another aspect of the present invention, a magnetic field shimming assembly is provided for shimming a temporally constant magnetic field of a magnetic resonance imaging apparatus. Annular magnets are disposed around a central bore within which an annular gradient coil assembly and an annular radio frequency coil assembly are disposed. The radio frequency coil assembly is disposed radially inward from the gradient coil assembly. The shimming assembly includes segmented ferrous material disposed in a plurality of rings between the radio frequency coil and the gradient coil assembly.

In accordance with more limited aspect of the present invention, a radio frequency shield is disposed between the segmented ferrous material rings and the gradient coil assembly.

In accordance with another more limited aspect of the present invention, the segmented ferrous material includes one of ferrous plates with an insulating coating, ferrous rods, ferrous strips, ferrous wire, and powdered ferrous material.

In accordance with another more limited aspect of the present invention, the gradient coil assembly includes primary magnetic field gradient coils and shield magnetic field gradient coils disposed in a spaced relationship. A plurality of trays extend longitudinally between the primary and shield gradient coils. The trays have pockets which each receive a selectively adjustable mass of ferrous material.

In accordance with another aspect of the present invention, a method of shimming a magnetic resonance imaging apparatus is provided. The imaging apparatus includes magnets disposed in a toroidal housing for defining a temporally constant magnetic field through its central bore. A gradient magnetic field coil assembly is disposed along the bore of the toroidal housing for causing gradients in the temporally constant magnetic field within the bore. A radio frequency coil is disposed radially inward from the gradient magnetic field coil assembly. A radio frequency shield is disposed between the gradient magnetic field coil assembly and the radio frequency coil. The method includes positioning rings of segmented ferrous material around the bore immediately contiguous to the radio frequency coil to adjust magnetic field uniformity of the temporally constant magnetic field.

In accordance with a more limited aspect of the present invention, trays are disposed parallel to the bore radially outward from at least one gradient coil of the gradient magnetic field coil assembly. The trays carry selectively adjustable masses of ferrous material.

In accordance with a still more limited aspect of the present invention, the uniformity of the temporally constant magnetic field in the bore is measured. The mass of ferrous material in one or both of the trays and the annular rings is adjusted in accordance with the measurement.

One advantage of the present invention is that the volume and massing of steel needed to shim higher order distortions is reduced, in the preferred embodiment by about a factor of 4.

Another advantage of the present invention is that radio frequency and gradient eddy currents in the shims is reduced.

Another advantage of the present invention resides in its compact design. The dimension between the magnets for generating the temporally constant magnetic field and the inside of the radio frequency coil is reduced. This allows a ratio of the patient bore diameter to the magnet diameter to be increased.

Another advantage of the present invention is that the shim material is isolated from the gradient magnetic field coil. Isolating the shims from the gradient magnetic field coil reduces vibrational effects due to interaction between the two. It also eliminates changes in the shim steel's magnetization due to temperature fluctuations associated with heating by the gradient coil. Gradient coils are often required to dissipate a few to 15 kilowatts or more due to resistive losses, causing temperature changes on the order of 40° C.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
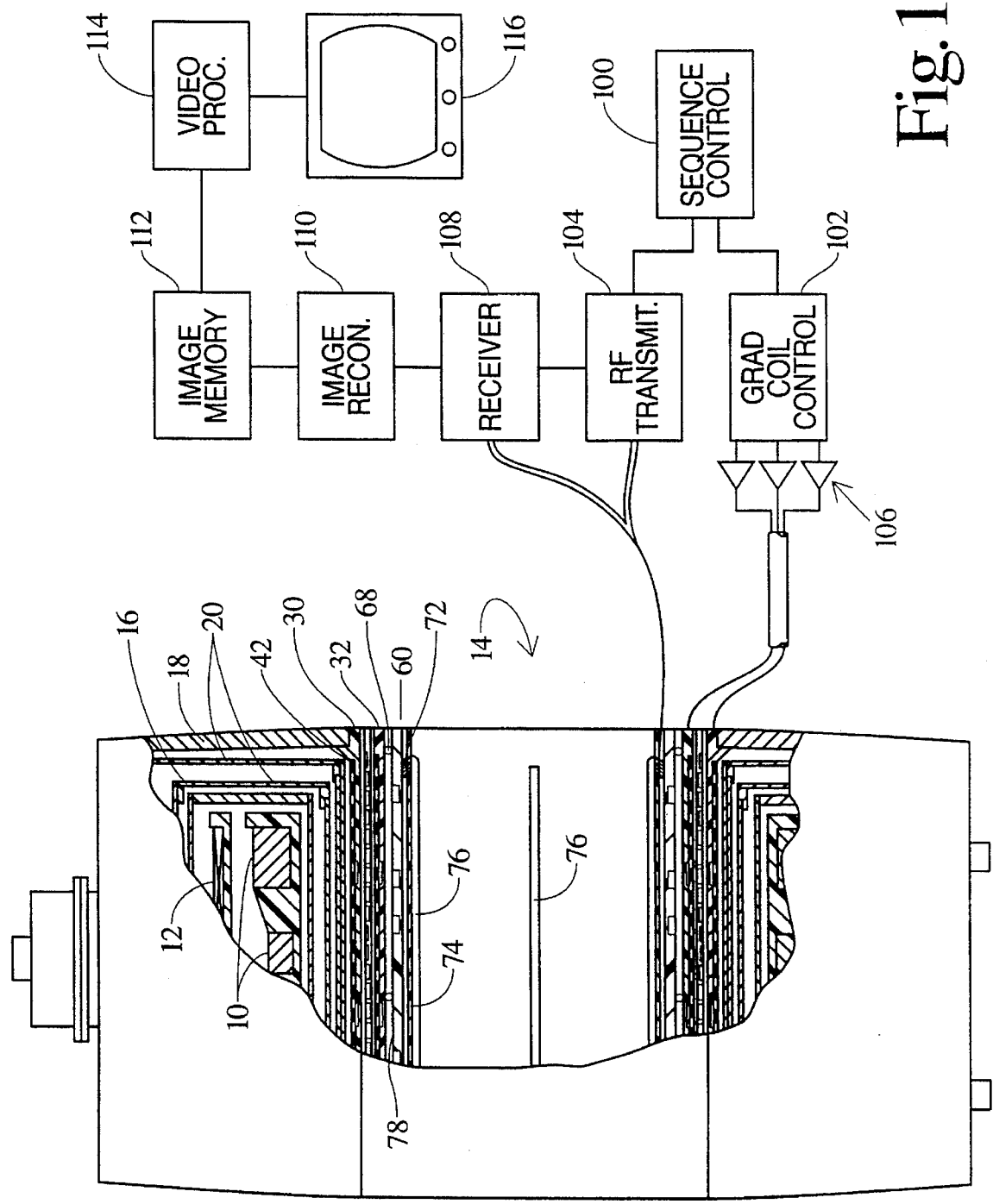
FIG. 1 is a diagrammatic illustration, in partial section, of a magnetic resonance imager in accordance with the present invention.

With reference to FIG. 1, a plurality of superconducting magnetic field coils, including primary coils 10 and shield coils 12, generate a temporally constant magnetic field. Within an imaging region at the geometric center of a bore 14, this magnetic field is substantially uniform and extends axially along a longitudinal or z-axis. X and y-axes are typically assigned to horizontal and vertical directions. In the preferred embodiment, the patient receiving bore of the magnetic resonance imaging apparatus has a length-to-diameter ratio of 1.6:1 to 1:1 or less. The superconducting magnetic field coils are disposed within a toroidal helium vessel or can 16. The helium vessel is filled with liquid helium to maintain the superconducting magnet coils at superconducting temperatures with the impressed magnetic field.

To reduce helium boil-off, the toroidal helium vessel 16 is surrounded by a toroidal vacuum vessel 18. One or more cold shields 20 are disposed between the vacuum vessel 18 and the helium vessel 16. The cold shields and the interior of the vacuum vessel are preferably chilled by mechanical refrigeration. Layers of aluminized mylar insulation are arranged between the vacuum vessel, the cold shields, and the helium vessel.

Figure 2:
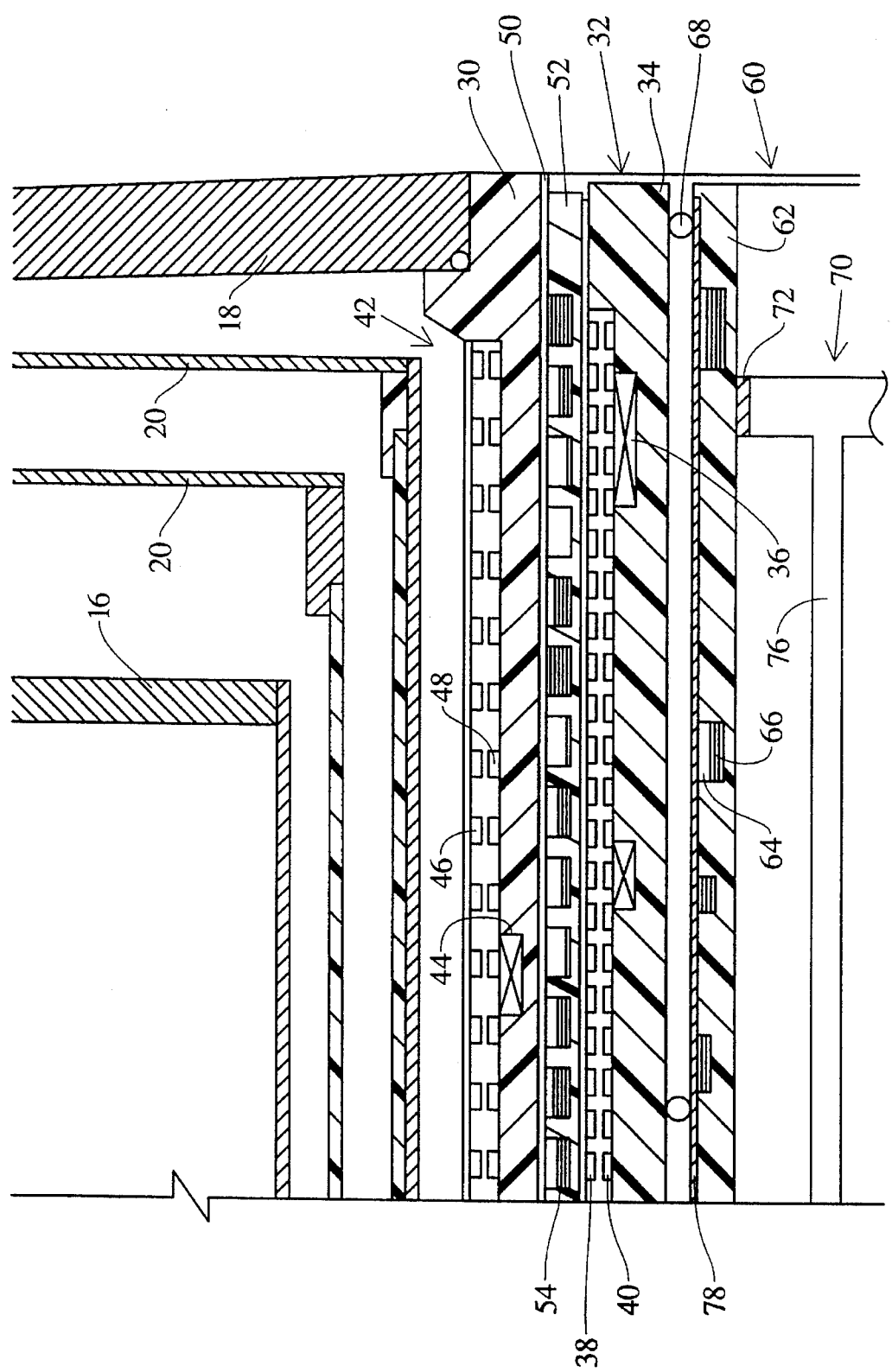
FIG. 2 is a detailed illustration of the radio frequency cell, the gradient coil assembly, and the shimming assembly of FIG. 1.

With continuing reference to FIG. 1 and further reference to FIG. 2, the vacuum vessel 18 includes a cylindrical wall 30 surrounding the bore. A primary gradient coil assembly 32 is mounted on an inner diameter of the dielectric cylinder 30. In the illustrated embodiment, the primary gradient coil includes a dielectric former 34 having grooves which receive annular z-gradient coil windings 36. X and y-gradient coils 38, 40 are wrapped around the dielectric former 34. Preferably, the gradient coils are potted in epoxy or the like.

A secondary or shield gradient coil 42 includes z-gradient shield coils 44 mounted in grooves in the dielectric cylinder 30. X and y-shield coils 46, 48 are wrapped around the dielectric cylinder The primary and secondary gradient coils are held in a spaced relationship by a plurality of radial spacers 50 such that a plurality of longitudinally extending pockets are defined between the primary and shield gradient coils. Shim trays 52 are mounted in the passages between the primary and secondary gradient coils. The shim trays 52 are constructed of a dielectric material that defines a series of pockets within which ferrous shims 54 are mounted. The distribution of shims along the shim tray is selected to optimize the uniformity of the magnetic field from the magnets 10, 12 in the imaging region. This region may be defined as an ellipsoidal, a circular cylindrical, or a spherical volume. The shims 54 are preferably thin plates of silicon steel that are coated with a dielectric material. Both grain-oriented and non-oriented steels may be used.

A radio frequency shield and shim assembly 60 includes a dielectric cylinder 62. The dielectric cylinder 62 has annular grooves 64 formed therein. For a given magnet design, the higher order distortions are predictable. Alternately, an initial magnet of a given design can have its magnetic field measured in the imaging region and corrections for the higher order harmonics calculated. The location of the grooves is selected in the dielectric ring 62 in accordance with the groove location measured for prior magnet systems. As yet another alternative, the field of each magnet assembly is measured and the grooves are custom cut. Ferrous shims 66 are mounted in the annular grooves 64.

A resilient mounting 68 connects the dielectric cylinder 62 with the primary gradient coil 32 in a non-vibration transmitting relationship. In this manner, any movement or vibration of the shims 66 due to interaction with the magnetic field gradients is minimized to maintain temporal stability of the main field.

A radio frequency coil assembly 70 is mounted inside the inner surface of the shimming coil assembly 62. In the illustrated embodiment, the radio frequency coil assembly includes conductive end rings 72 at opposite ends of the inner surface of the dielectric cylinder 62. Optionally, a cosmetic face plate 74 (not shown in FIG. 2) covers the conductive rings 72 and the inner surface of the dielectric cylinder 62. A series of connectable and disconnectable radio frequency coil elements or legs 76 are releasably connected with the annular rings 72. The coil elements are encased in a dielectric material. By connecting different legs 76 with the annular end rings 72, birdcage coils with different numbers of legs or differently tuned legs and characteristics can be assembled. Of course, radio frequency coils with fixed legs, as shown in FIG. 2, are also contemplated.

A radio frequency shield 78 is disposed around the outer surface of the cylinder 62. The RF screen, in one embodiment, is a copper mesh. Other RF screens such as slotted copper foil and the like are also contemplated. In the illustrated embodiment, the RF screen passes over the shim rings 66 such that the shim rings are inside the radio frequency shield. Alternately, the radio frequency shield can be configured to conform with the annular grooves 64 and be mounted to the cylinder 62 prior to loading of the shims 66. Optionally, the radio frequency coil can be a separate structure which is slidably inserted into the bore of the dielectric cylinder 62. For example, the radio frequency coil may be constructed of copper foil strips adhered to the surface of a light-weight dielectric cylinder.

Figure 3:
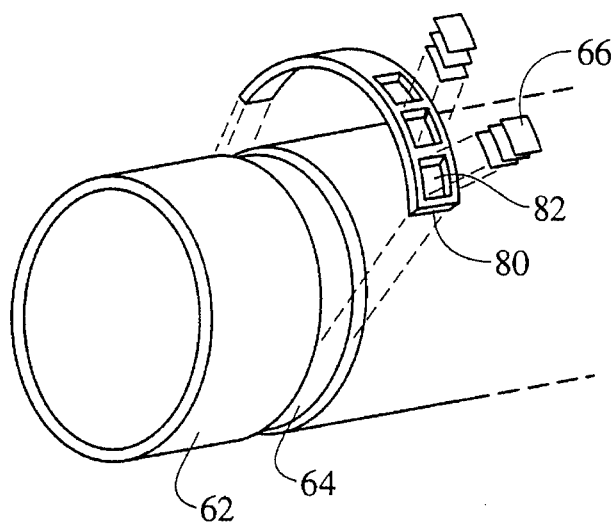
FIG. 3 is an exploded view of the radio frequency coil and shimset assembly of FIG. 1.

With reference to FIG. 3, in one preferred embodiment, dielectric members 80 fit within the groove 64. Each dielectric member 80 has a series of pockets 82 which receive an appropriate stack of the shims 66.

Figure 4:
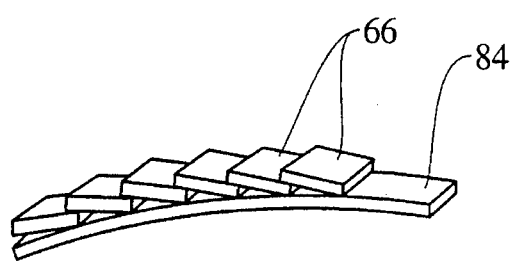
FIG. 4 illustrates an alternate embodiment to the shim ring of FIG. 2.

In the embodiment of FIG. 4, a series of metal shims 66, each covered with a thin dielectric coating, are adhered to a flexible strip 84. Preferably, the shims 66 are mounted in a lapped or scale-like fashion to the flexible strip 84. The strip 84 and the shims are dimensioned to be received within the groove 64. The strip of shims are wrapped around the groove 64 one or more times as may be appropriate to provide the prescribed mass of ferrous material.

Figure 5:
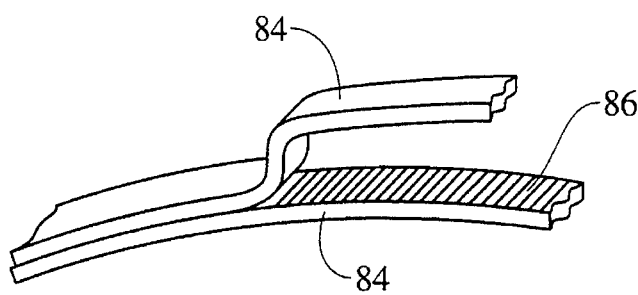
FIG. 5 illustrates another alternate embodiment of the shim rings.

With reference to FIG. 5, the ferrous material may be in other forms than thin plates. For example, ferrous wires or strips 86 can be mounted in a closely spaced relationship on an insulating flexible dielectric layer 84 or between two such layers.

Figure 6:
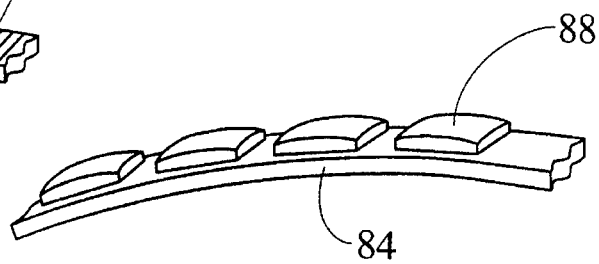
FIG. 6 illustrates another alternate embodiment of the shimming material.

With reference to FIG. 6, the ferrous material can also be in powdered form. In the illustrated embodiment, the flexible dielectric material 84 defines a series of pockets which are filled with powdered ferrous material 88. The strip 84 is again wrapped around the groove 64 until the required ferrous mass is achieved. Alternately, the powdered ferrous material can be mixed with an epoxy or other bonding agent and be applied to the grooves like a cement or putty or as pre-cured shims of various thicknesses.

Figure 7:
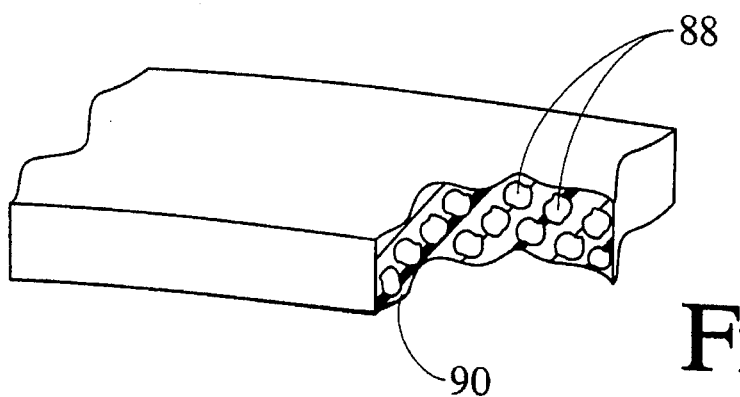
FIG. 7 is a sectional view of an alternate embodiment of the shimming material.

With reference to FIG. 7, the powdered ferrous material be is encased in a flexible dielectric matrix 90. strips of the flexible dielectric matrix with encased ferrous powder are wrapped in the grooves 64. The ferrous powder elements may be microspheres, microrods, or other structure with a high packing factor.

Figure 8:
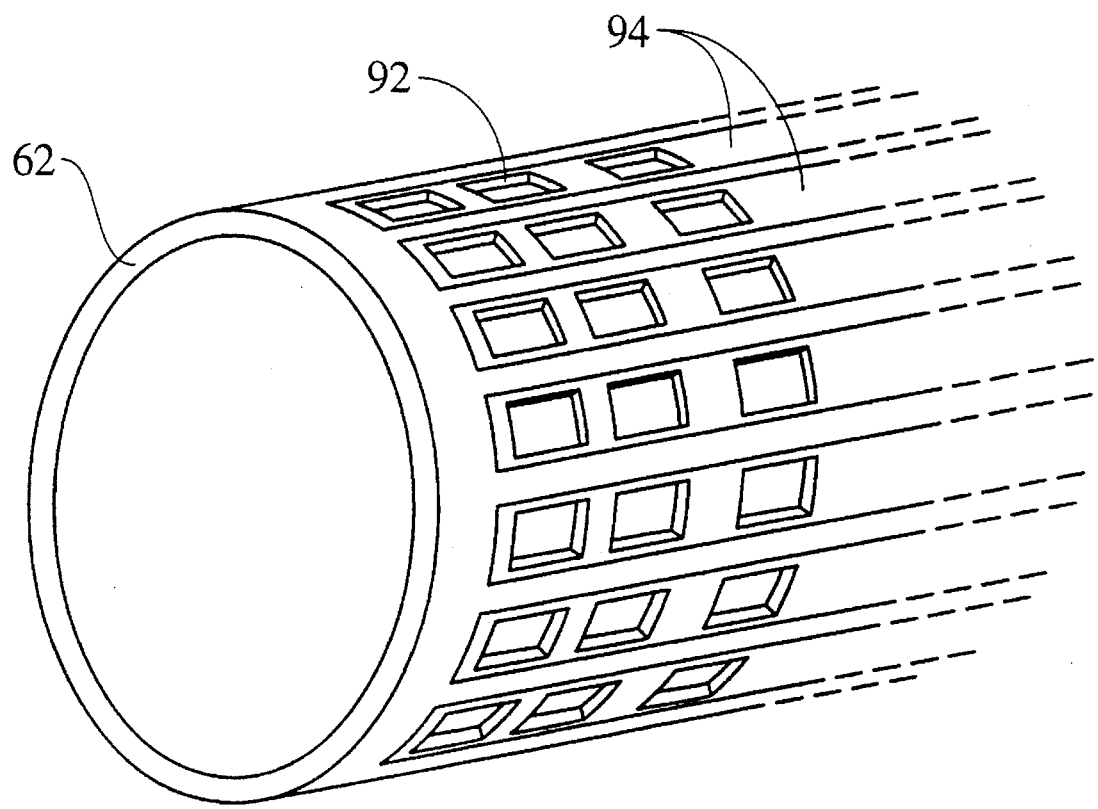
FIG. 8 is another embodiment of the shimming system of the present invention; and, FIG. 9 is a cross-sectional view illustrating yet another embodiment of the shimming material.

With reference to FIG. 8, the segmented ferrous rings are defined by circumferentially aligned pockets 92 of trays 94 that are inserted longitudinally into the dielectric cylinder 62. Ferrous shims, such as ferrous plates, powders, and the like, are loaded into the pockets 92 to define the circumferential rings.

Figure 9:
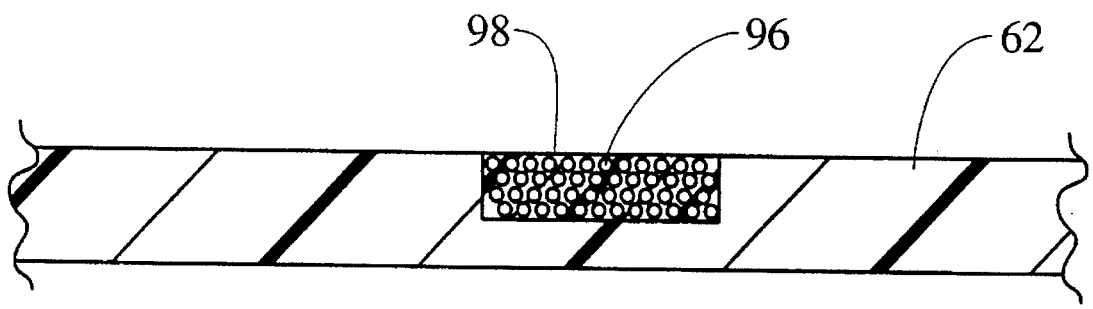

With reference to FIG. 9, the ferrous shim material, a submillimeter ferrous wire 96 is wound on the dielectric cylinder or in the groove 64 in a tightly packed bundle. An epoxy matrix 98 insulates the turns of the fine wire from each other. Optionally, the wire may be composed of braided fiber segments.

Various other techniques for loading the grooves 64 with a preselected amount of ferrous material are also contemplated. The ferrous material is in relatively small sections to limit eddy currents induced by the radio frequency coil in the transmit mode and to limit eddy currents induced by the gradient coil assembly. Eddy currents limited to small spatial regions die out relatively quickly and are relatively weak. Thin rods and powdered material have a very limited ability to support eddy currents. On the other hand, if continuous metal flat loops were positioned around the examination region, sufficient eddy current and z-gradient mutual coupling problems could be expected. The present invention enables annular iron shims to be constructed from discontinuous steel elements. In this manner, effective shimming is provided while inhibiting detrimental eddy currents.

In use, the magnetic field inhomogeneity is calculated or measured using a magnetic field probe. For example, an initial magnetic resonance imaging apparatus can have its magnetic fields measured on the surface of a spherical imaging volume using a magnetic field measuring probe and appropriate masses and positions of shimming material calculated. In subsequently manufactured scanners, the placement and mass of steel for shimming higher order components will be similar. Accordingly, the annular shimming assembly 60 can be initially manufactured to be substantially the same from machine to machine. After preliminary assembly, the magnetic field is measured and the ferrous mass and position requirements for further shimming are determined. Based on these determinations, the shims 54 and the shim trays 52 can be adjusted, as can the shimming in the annular shim assembly 60. For significant shimming for higher order components, adjusting the mass of ferrous material in the annular shim assembly 60 is preferred. For fine adjustments in high or low order distortions, adjusting the shims in shim tray 50 can be done conveniently.

With reference again to FIG. 1, a sequence control 100 controls a gradient control 102 and a radio frequency transmitter 104. The gradient control 102 is connected with a series of current pulse generators 106, which, in turn, are connected with the primary gradient coils 32 and the secondary gradient coils 42. The radio frequency transmitter 104, preferably a digital transmitter, is connected with the radio frequency coil 70 for generating pulses of radio frequency signals for exciting and manipulating magnetic resonance in selected dipoles of a portion of a subject within the imaging region of the bore. A radio frequency receiver 108, preferably a digital receiver, is connected with the radio frequency coil 70 or surface coils (not shown) for demodulating magnetic resonance signals emanating from the portion of the subject in the examination region. An image reconstruction processor 110 reconstructs the received magnetic resonance signals into an electronic slice or volume image representation, preferably by using a two-dimensional Fourier type transform reconstruction algorithm. The electronic image representation is stored in an image memory 112. A video processor 14 converts selectable slices or other portions of the electronic images stored in the image memory 12 into appropriate format for display on a human-readable monitor 116.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In a magnetic resonance imaging apparatus that includes magnets disposed in a toroidal housing for defining a temporally constant magnetic field through a central bore of the toroidal housing, a radio frequency coil disposed in the bore, a radio frequency shield disposed around the radio frequency coil, and a gradient magnetic field coil assembly including a primary magnetic field gradient coil and a shield gradient magnetic field coil, the gradient magnetic field coil assembly being disposed radially outward from and around the radio frequency shield, the improvement comprising:

segmented ferrous material disposed in annular rings around the bore, the segmented ferrous material rings being disposed between the radio frequency coil and the radio frequency shield; and shim trays being disposed between the primary and secondary gradient magnetic field coils, the shim trays carrying selectively adjustable numbers of ferrous shims.

2. In the magnetic resonance imaging apparatus as set forth in claim 1, the improvement further comprising:

a cylindrical dielectric tube having a plurality of annular grooves defined in an outer circumference thereof, the segmented ferrous material rings being mounted in the grooves.

3. In the magnetic resonance imaging apparatus as set forth in claim 1, the improvement further comprising:

the segmented ferrous material including one of:

ferrous plates with an insulating coating, ferrous rods, ferrous strips, ferrous wire, and powdered ferrous material.

4. In a magnetic resonance imaging apparatus that includes magnets disposed in a toroidal housing for defining a temporally constant magnetic field through a central bore of the toroidal housing, a radio frequency coil disposed in the bore, and a radio frequency shield disposed around the radio frequency coil, the improvement comprising:

a cylindrical dielectric tube surrounding the bore between the radio frequency coil and the radio frequency shield, the cylindrical dielectric tube having a plurality of annular grooves defined in a circumference thereof;

segmented ferrous material disposed around the bore in the annular grooves, the segmented ferrous material including one of a multiplicity of electrically insulated ferrous plates, ferrous rods, ferrous strips, ferrous wire, and powdered ferrous material affixed to a flexible carrier.

5. A magnetic field shimming assembly for shimming out harmonics over $Z^6$ of a temporally constant magnetic field of a magnetic resonance imaging apparatus that has annular magnets surrounding a short central bore within which an annular gradient coil and an annular radio frequency coil are received, the radio frequency coil being disposed radially inward from the gradient coil, the shimming assembly including:

segmented ferrous material disposed in a plurality of rings between the radio frequency coil and the gradient coil assembly for coarsely shimming out the harmonics over $Z^6$; and, a plurality of shim trays disposed around the bore, the shim trays carrying selectively adjustable numbers of ferrous shims for finely adjusting the shimming.

6. The shimming assembly as set forth in claim 5 further including a dielectric cylinder that has a plurality of annular grooves defined therein, the segmented ferrous material being received in the annular grooves.

7. The shimming assembly as set forth in claim 5 wherein the ferrous material includes one of:

ferrous plates with an insulating coating, ferrous rods, ferrous strips, ferrous wire, and powdered ferrous material.

8. The shimming assembly as set forth in claim 5 further including a radio frequency shield disposed between the segmented ferrous material rings and the gradient coil assembly such that the ferrous material is on the same side of the radio frequency shield as the radio frequency coil.

9. The shimming assembly as set forth in claim 8 further including shield magnetic field gradient coils disposed in a spaced relationship radially outward from the gradient coil and wherein the plurality of shim trays extend longitudinally in the space between the gradient coil and the shield coil, the shim trays each having a plurality of pockets which receive the selectively adjustable number of ferrous shims.

10. A method of shimming a magnetic resonance imaging apparatus which includes magnets disposed in a toroidal housing for defining a temporally constant magnetic field through a central bore of the toroidal housing, a gradient magnetic field coil assembly disposed along the bore of the toroidal housing for causing gradients in the magnetic field within the bore, a radio frequency coil supported by a dielectric former radially inward from the gradient magnetic field coil assembly, and a radio frequency shield disposed between the radio frequency coil and the gradient magnetic field coil assembly, the method comprising:

wrapping a flexible carrier which carries segmented ferrous material around the dielectric former, to define rings of the segmented ferrous material around the central bore immediately contiguous to the radio frequency coil to adjust magnetic field uniformity, of the temporally constant magnetic field.

11. The method as set forth in claim 10 wherein the segmented ferrous material includes one of:

ferrous plates with an insulating coating, ferrous rods, ferrous strips, ferrous wire, and powdered ferrous material.

12. A method of shimming a magnetic resonance imaging apparatus which includes magnets disposed in a toroidal housing for defining a temporally constant magnetic field through a central bore of the toroidal housing, a gradient magnetic field coil assembly disposed along the bore of the toroidal housing for causing gradients in the magnetic field within the bore, a radio frequency coil disposed radially inward from the gradient magnetic field coil assembly, and a radio frequency shield disposed between the radio frequency coil and the gradient magnetic field coil assembly, the method comprising:

positioning rings of segmented ferrous material around the central bore immediately contiguous to the radio frequency coil to adjust magnetic field uniformity of the temporally constant magnetic field; and disposing longitudinal trays parallel to the bore radially outward from at least one gradient coil of the gradient magnetic field coil assembly, the trays carrying selectively adjustable masses of ferrous material.

13. The method as set forth in claim 12 wherein the step of positioning the segmented ferrous material includes positioning the segmented ferrous material in annular grooves of a dielectric former.

14. The method as set forth in claim 12 further including:

measuring a uniformity of the temporally constant magnetic field within the bore;

adjusting the mass of ferrous material carried by the trays in accordance with the measurement.

15. The method as set forth in claim 12 further including adjusting the mass of ferrous material in the annular rings in accordance with the measurement.

16. A magnetic resonance imaging apparatus comprising:

magnets disposed in a toroidal housing for defining a temporally constant magnetic field through a central bore of the toroidal housing, the bore having a length-to-diameter ratio of less than 1.6:1;

a radio frequency coil disposed around the bore;

a radio frequency shield disposed around the radio frequency coil;

a gradient magnetic field coil between the toroidal housing and the radio frequency shield;

segmented ferrous material disposed in annular rings around the bore, the segmented ferrous material rings being disposed contiguous to the radio frequency shield;

a plurality of shim trays disposed radially outward from the radio frequency shield, the shim trays carrying selectively adjustable numbers of ferrous shims.

* * * * *